(12) United States Patent
Hazelton (10) Patent No.: US 7,283,210 B2
(45) Date of Patent: Oct. 16, 2007

(54) IMAGE SHIFT OPTIC FOR OPTICAL SYSTEM

(75) Inventor: Andrew J. Hazelton, Yokohama (JP)

(73) Assignee: Nikon Corporation, Tokyo (JP)

( * ) Notice: Subject to any disclaimer, the term of this patent is extended or adjusted under 35 U.S.C. 154(b) by 63 days.

(21) Appl. No.: 11/088,210

(22) Filed: Mar. 22, 2005

(65) Prior Publication Data

US 2006/0215133 A1  Sep. 28, 2006

(51) Int. Cl.
*G03B 27/50* (2006.01)
*G03B 27/42* (2006.01)
*G03B 27/32* (2006.01)

(52) U.S. Cl. .............................. 355/72; 355/53; 355/77

(58) Field of Classification Search ................. 355/53, 355/67, 68, 77, 72; 430/30, 311
See application file for complete search history.

(56) References Cited

U.S. PATENT DOCUMENTS

| | | | |
|---|---|---|---|
| 4,748,477 A | 5/1988 | Isohata et al. | |
| 5,103,257 A | * 4/1992 | Wijnaendts-van-Resandt ... | 355/53 |
| 5,227,839 A | 7/1993 | Allen | |
| 5,255,051 A | 10/1993 | Allen | |
| 5,528,118 A | 6/1996 | Lee | |
| 5,623,853 A | 4/1997 | Novak et al. | |
| 5,668,672 A | 9/1997 | Oomura | |
| 5,689,377 A | 11/1997 | Takahashi | |
| 5,786,901 A | 7/1998 | Okada et al. | |
| 5,815,310 A | 9/1998 | Williamson | |
| 5,834,761 A | 11/1998 | Okada et al. | |
| 5,835,275 A | 11/1998 | Takahashi et al. | |
| 5,874,820 A | 2/1999 | Lee | |
| 6,724,466 B2 | 4/2004 | Ono et al. | |

FOREIGN PATENT DOCUMENTS

| | | |
|---|---|---|
| JP | 7-142331 | 6/1995 |
| JP | 08-166475 | 6/1996 |
| JP | 08/330224 | 12/1996 |

* cited by examiner

*Primary Examiner*—Alan Mathews
(74) *Attorney, Agent, or Firm*—Beyer Weaver LLP (57) ABSTRACT

An apparatus for adjusting image formation includes a first stage, a second stage, an optical element, a counterweight, and an actuator. The first stage is operable to project an original image. A final image corresponding to the original image is formed on the second stage. The optical element is movable with at least one degree of freedom operable to shift a position of the final image. The counterweight is movable with the at least one degree of freedom. The actuator is operable to actuate the optical element and the counterweight in opposite directions.

24 Claims, 5 Drawing Sheets

IMAGE SHIFT OPTIC FOR OPTICAL SYSTEM

BACKGROUND OF THE INVENTION

The present invention relates generally to an image forming system, and more specifically to methods and apparatus for adjusting image formation used for semiconductor process.

Current integrated circuit (IC) manufacturing practices use lithography photomasks (reticles) to apply various patterns to a photosensitized semiconductor wafer used to create the ICs. Reticles are typically high-precision plates that contain a pattern of extremely small images of the various components of an electronic circuit. A reticle is used as a master to transfer a plurality of the circuit patterns onto a photosensitized wafer. Current state-of-the-art lithographic systems often must position an ultra-fine image to within 15 nanometers. Current circuit architectures often have conductor linewidths as narrow as 30 nanometers. Accordingly, lithography processing equipment requires advanced precision optical and mechanical systems and even higher precision systems will be required in the future, as still smaller images become common.

Lithographic exposure apparatuses are used to project images from the reticle onto the photosensitized wafer during semiconductor processing. A typical exposure apparatus includes a base frame having a lower enclosure that contains a wafer stage for holding a semiconductor wafer workpiece. The base frame also supports an optical device that holds a reticle stage and is arranged to project the images from a reticle carried by the reticle stage onto the wafer workpiece. The base frame typically supports the optical device through a vibration isolation system designed to damp and isolate vibrations between components of exposure apparatus so that vibrations in one component are not transmitted to the other.

In some lithography systems a reticle is moved synchronously with a wafer to allow an image formed by the reticle to be patterned onto the wafer. For various reasons, the resulting image from the reticle may not be imaged at the desired location on the wafer. The prior art may try to shift the reticle or wafer to correct this positional error. Such corrective movements of the already moving reticle or wafer may be difficult. Also, synchronization error can be a problem in conventional systems.

As such, it becomes increasingly necessary to devise a system that provides low reaction forces generated by the actuation of the optical element, thus avoiding transmission of vibration to other elements of the system.

SUMMARY OF THE INVENTION

The present invention addresses the needs described above by providing methods and apparatus which reduce or cancel vibration generated by actuating an optical element used in an image forming system, such as a photolithography system, reduce positional errors, or correct or compensate synchronization errors.

Various embodiments of the present invention include a first stage operable to project an original image, a second stage on which a final image corresponding to the original image is formed, and an optical element movable with at least one degree of freedom operable to shift a position of the final image. Some embodiments of the present invention further include a counterweight movable with the at least one degree of freedom, and an actuator operable to actuate the optical element and the counterweight in opposite directions.

According to the embodiments of the present invention, a mirror and a counterweight are actuated in a substantially opposite direction, thereby reducing or substantially canceling reaction forces caused by moving the mirror. Since the reaction forces are reduced or substantially canceled, the embodiments of the present invention prevent vibration from being transmitted to other elements of the system or transmitted outside of the system, thereby remaining unaffected by vibration deteriorating the image forming process, such as a photolithography process.

One embodiment of the present invention includes a first stage, a second stage, an optical element, a counterweight, and an actuator. The first stage is operable to project an original image. A final image corresponding to the original image is formed on the second stage. The optical element is movable with at least one degree of freedom operable to shift a position of the final image. The counterweight is movable with the at least one degree of freedom. The actuator is operable to actuate the mirror and the counterweight in opposite directions.

In a specific embodiment, the first stage is operable to hold a reticle, and the second stage is operable to hold a wafer. In another specific embodiment, a weight of the counterweight is substantially the same as a weight of the mirror.

The embodiment having the counterweight may further include a controller. Such a controller is operable to receive a first input, a second input, and to output a first output. The first input corresponds to a desired final image position. The second input corresponds to an actual final image position. The controller outputs the first output for actuating the optical element based on the desired final image position and the actual final image position. The actuator actuates the optical element based on the first output. In a specific embodiment, the controller is operable to output a second output for actuating the first stage, and to output a third output for actuating the second stage.

In another embodiment, the optical element is a flat mirror and is actuated to tilt with respect to an axis connecting the original image and the final image. Alternatively, the optical element is a retroreflective mirror and is actuated to move substantially perpendicular to an axis connecting the original image and the final image.

In still another embodiment, the at least one degree of freedom is two degrees of freedom.

Some embodiments of the present invention provide methods for adjusting image formation. According to the method, an original image is projected from a first stage. A final image corresponding to the original image is formed on a second stage. An optical element and a counterweight are actuated in opposite directions to shift a position of the final image.

A further understanding of the nature and advantages of the present invention may be realized by reference to the remaining portions of the specification and the drawings.

BRIEF DESCRIPTION OF THE DRAWING

The invention, together with further objects and advantages thereof, may best be understood by reference to the following description taken in conjunction with the accompanying drawings in which.

DETAILED DESCRIPTION OF SPECIFIC EMBODIMENTS

Various embodiments of the present invention will now be described in detail with reference to the drawings, wherein like elements are referred to with like reference labels throughout.

Reference will now be made in detail to a specific embodiment of the invention. An example of this embodiment is illustrated in the accompanying drawings. While the invention will be described in conjunction with this specific embodiment, it will be understood that it is not intended to limit the invention to one embodiment. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

Figure 4:
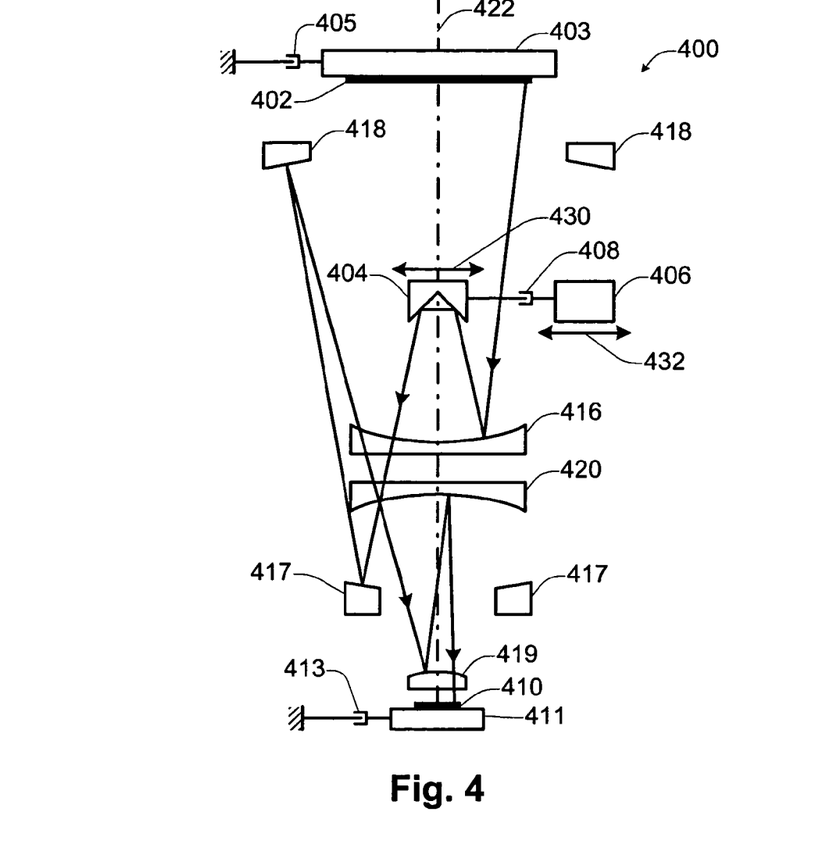
FIG. 4 is a schematic diagram of one embodiment according to the present invention.

FIG. 4 is a schematic diagram of one embodiment according to the present invention. The embodiment of an optical projection system 400 uses a reticle 402 to project an original image. The optical projection system 400 may be used in, for example, photolithography for manufacturing semiconductor devices. The system 400 includes a moving mirror 404, a counterweight 406, an actuator 408, and mirrors 416-420. The ray from the reticle 402 is reflected by mirrors 404 and 416-420, and ultimately reaches a wafer 410. Thus, a final image corresponding to the original image projected by the reticle 402 is formed on the wafer 410. Typically, the reticle 402 and the wafer 410 are detachably mounted on a reticle stage 403 and a wafer stage 411, respectively. The reticle 402, the mirrors 404 and 416-420, and the wafer 410 are symmetrically provided with respect to an optical axis 422. In this specification, the "ray" utilized for embodiments of the invention may be any suitable light or electromagnetic radiation having a wavelength suitable for imaging through the mirrors 404 and 416-420.

The reticle stage 403 and the wafer stage 411 are actuated by actuators 405 and 413, respectively, so that the reticle 402 and the wafer 410 are synchronously moved to scan the reticle 402 and project the image of the reticle onto the wafer 410 for patterning the wafer 410. If the position of the final image on the wafer stage 410 is not the same as the desired position of the final image on the wafer stage 410, a controller causes the moving mirror 404 to correct or compensate the "synchronization errors." Since the controller may have the reticle stage 403 and wafer stage 411 move at high speeds to provide a fast scanning, it may be easier for the controller to move the mirror 404 to correct or compensate the synchronization errors.

The actuator 408 actuates the moving mirror 404 in order to correct or compensate the synchronization errors in positioning the reticle 402 and the wafer 410. In this specific embodiment, the moving mirror 404 is moved along a direction 430 with one degree of freedom to shift a position of the final image on the wafer 410. However, it should be appreciated that the moving mirror 404 may be moved with more than one degree of freedom to shift the position of the final image on the wafer 410. For example, in another embodiment of the present invention, the actuator 408 actuates the moving mirror 404 and the counterweight 406 with two degrees of freedom in orthogonal directions.

The actuator 408 actuates the moving mirror 404 and the counterweight 406 in opposite directions. Specifically, in this embodiment, the counterweight 406 is moved along a direction 432 with one degree of freedom. However, when the moving mirror 404 is moved with more than one degree of freedom to shift the position of the final image on the wafer 410, the counterweight 406 is also moved with more than one degree of freedom. In this specific embodiment, the weight of the counterweight 406 is substantially the same as the weight of the moving mirror 404.

According to various embodiments of the present invention, the mirror 404 and the counterweight 406 are actuated in substantially opposite directions, thereby reducing or substantially canceling reaction forces caused by moving the mirror 404. For example, when the mirror 404 moves to the right along the direction 430 in FIG. 4, the counterweight 406 moves to the left along the direction 432 in FIG. 4, and vice versa. Since the reaction forces are reduced or substantially canceled, the embodiments of the present invention prevent vibration from being transmitted to other elements of the system 400 or transmitted outside of the system 400, thereby remaining unaffected by vibration deteriorating the photolithography process.

In the embodiment shown in FIG. 4, the moving mirror 404 is a retroreflective mirror and is actuated to move substantially perpendicular to the optical axis 422 which connects the original image on the reticle 402 and the final image on the wafer 410. The moving mirror 404 may be a part of a quadratic cone.

It should be appreciated that the moving mirror 404 may be any suitable reflective optical element, or combination of such reflective optical elements. The embodiment shown in FIG. 4 includes the counterweight 406, and the actuator 408. However, it should be appreciated that some embodiments of the present invention may be implemented without using the counterweight 406, and the actuator 408. In other words, especially when the reaction force caused by movement of the moving mirror 404 is sufficiently small or negligible, the counterweight 406, and the actuator 408 may be omitted.

Figure 5:
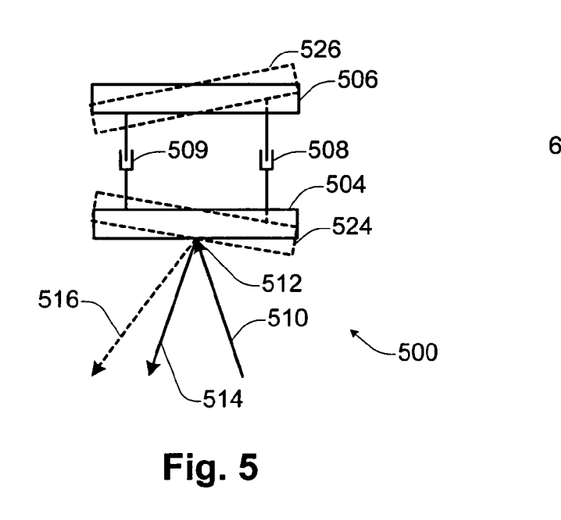
FIG. 5 is a schematic diagram of an alternative moving mirror unit 500 for an embodiment of the present invention.

FIG. 5 is a schematic diagram of an alternative moving mirror unit 500 for an embodiment of the present invention. Instead of using the moving mirror 404 which is a retroreflective mirror, a moving mirror 504 which is a flat mirror may be utilized as illustrated in FIG. 5. Actuators 508 and 509 actuate the moving mirror 504 in order to correct or compensate the synchronization errors so that the reticle 402 and the wafer 410 are synchronously moved to scan the reticle 402.

The actuators 508 and 509 actuate the moving mirror 504 to tilt with respect to the optical axis 422 connecting the original image on the reticle 402 and the final image on the wafer 410. The actuators 508 and 509 actuate the moving mirror 504 and a counterweight 506 in opposite directions with at least one degree of freedom similar to the embodiment shown in FIG. 4. In this specific embodiment, the weight of the counterweight 506 is substantially the same as the weight of the moving mirror 504.

When the moving mirror 504 is in a default position as indicated by the solid boundary, an incident ray 510 is reflected at a point 512 by the moving mirror 504, and is transmitted as a reflected ray 514. When the moving mirror 504 tilted into a position 524, the incident ray 510 is reflected at the point 512 by the moving mirror 504, and is transmitted as a reflected ray 516. When the actuators 508 and 509 actuate the mirror 504 in the tilted position 524, the counterweight 506 is also actuated in a position 526 so that the movement of the moving mirror 504 and the counterweight 506 reduces or substantially cancels reaction forces caused by moving the mirror 504.

Figure 6:
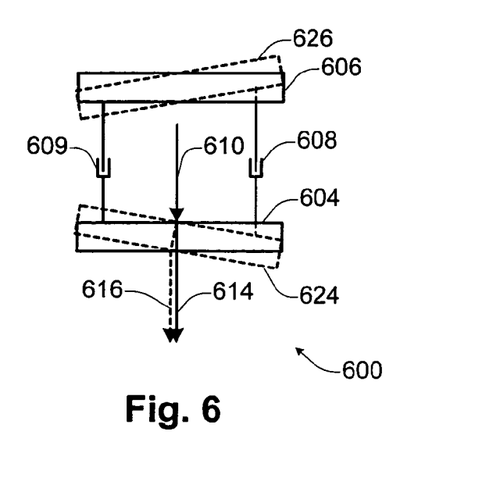
FIG. 6 is a schematic diagram of an another alternative moving mirror unit 600 for an embodiment of the present invention.

FIG. 6 is a schematic diagram of an another alternative moving mirror unit 600 for an embodiment of the present invention. Instead of using the moving mirror 404 which is a retroreflective mirror, a moving lens 604 which is a flat lens may be utilized as illustrated in FIG. 6. Actuators 608 and 609 actuate the moving lens 604 in order to correct or compensate the synchronization errors so that the reticle 402 and the wafer 410 are synchronously moved to scan the reticle 402. The actuators 608 and 609 actuate the moving lens 604 to tilt with respect to the optical axis 422 connecting the original image on the reticle 402 and the final image on the wafer 410. The actuators 608 and 609 actuate the moving lens 604 and a counterweight 606 in opposite directions with at least one degree of freedom similar to the embodiment shown in FIG. 4. In this specific embodiment, the weight of the counterweight 606 is substantially the same as the weight of the moving lens 604.

When the moving lens 604 is in a default position as indicated by the solid boundary, an incident ray 610 pass through the moving lens 604, and is transmitted as a ray 614. When the moving lens 604 tilted into a position 624, the incident ray 610 is refracted by the moving lens 604, and is transmitted as a refracted ray 616. When the actuators 608 and 609 actuate the lens 604 in the tilted position 624, the counterweight 606 is also actuated in a position 626 so that the movement of the moving lens 604 and the counterweight 606 reduces or substantially cancels reaction forces caused by moving the lens 604.

In the embodiment shown in FIG. 4, the mirror 404 is actuated by the actuator 408 to correct or compensate the synchronization errors. However, it should be appreciated that one of the other mirrors 416-420 may be actuated for scanning purposes instead of the mirror 404. Alternatively, more than one mirrors among the mirrors 404 and 416-420 may be actuated for scanning purposes. In some embodiments, combination of moving mirrors illustrated in FIGS. 4-6 may be utilized in the system 400. In another embodiment, the lens 604 shown in FIG. 6 may be actuated by an actuator instead of a mirror to scan the reticle 402. In other words, according to the various embodiments of the invention, an "optical element" is actuated by an actuator to correct or compensate the synchronization errors. Thus, in this specification, the "optical element" includes any suitable optical elements to correct or compensate the synchronization errors.

Figure 7:
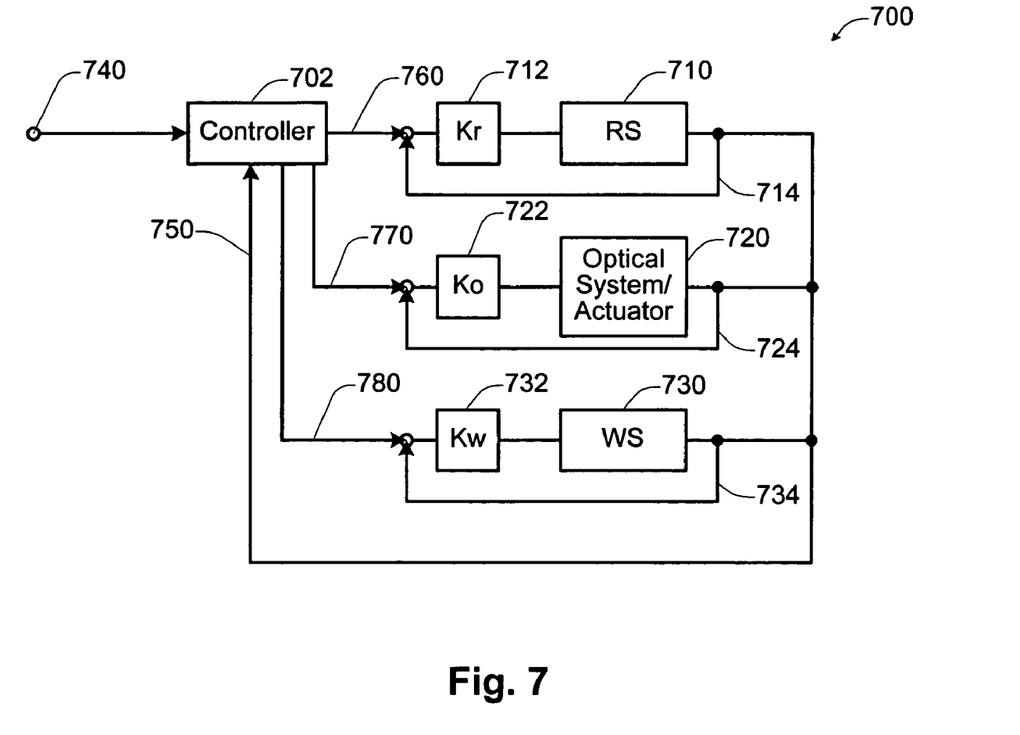
FIG. 7 is a block diagram of another embodiment according to the present invention.

FIG. 7 is a block diagram of another embodiment according to the present invention. A system for adjusting image formation 700 includes a controller 702, a reticle stage 710, an optical system 720, and a wafer stage 730. The reticle stage 710 projects an original image from, for example, a reticle or a mask. A final image corresponding to the original image is formed on the wafer stage 730. The optical system 720 may include one or more suitable optical elements such as lenses and mirrors to shift a position of the final image while scanning the reticle.

The reticle stage 710, the optical system 720, and the wafer stage 730 have a reticle stage control function 712, an optical system control function 722, and a wafer stage control function 734, respectively. A series connection of the reticle stage 710 and the reticle stage control function 712 has a feedback loop 714. A series connection of the optical system 720 and the optical system control function 722 has a feedback loop 724. A series connection of the wafer stage 730 and the wafer stage control function 732 has a feedback loop 734.

The controller 702 receives an input 740 corresponding to a desired final image position, and an input 750 corresponding to an actual final image position. The controller 702 outputs an output 770 for actuating the optical system 720 based on the desired final image position 740 and the actual final image position 750. The optical system 720 is actuated by an actuator based on the output 770. When the reticle stage 710 is actuated by an actuator, an output 760 from the controller 702 may be used to control the actuator for the reticle stage 710. Similarly, when the wafer stage 730 is actuated by an actuator, an output 780 from the controller 702 may be used to control the actuator for the wafer stage 730.

The controller 702 functions as a feedback controller based primarily on the inputs 740 and 750 so that the difference between the inputs 740 and 750 is substantially zero or small enough. The controller 702 may be implemented by any combination of hardware and/or software to achieve such a function. The hardware and software included in the controller 702 may be any combination of hardwired logic and/or programmable logic.

In this specific embodiment shown in FIG. 7, the reticle stage 710, the optical system 720, and the wafer stage 730 may be the corresponding elements included in the system 400 shown in FIG. 4. However, in this specific embodiment, the system 700 does not have to include the counterweight 406 and the actuator 408.

In one method of using the controller 702, the reticle stage 710 and the wafer stage 730 may be moved synchronously to cause a scanning of the reticle for patterning on the wafer. The controller 702 may have an input according to the actual position of a final image on the wafer stage 730. If the position of the final image on the wafer stage is not the same as the desired position of the final image on the wafer stage, the controller 702 causes the optical system 720 to correct or compensate the synchronization errors. Since the controller 702 may have the reticle stage 710 and wafer stage 730 move at high speeds to provide a fast scanning, it may be easier for the controller 702 to move the optical system 720 to provide the desired error correction.

According to still another embodiment of the present invention, the system 400 shown in FIG. 4 is incorporated into the system 700 shown in FIG. 7 so that the optical system 720 includes the moving mirror 404, the counterweight 406, and the actuator 408. Alternatively, such a combination of the systems shown in FIGS. 4 and 7 may utilize at least one of the optical units 500 and 600 shown in FIGS. 5 and 6, respectively.

As described above referring to FIGS. 4-7, the term "optical element" or "optical system" in this specification means any suitable optical part or combination of a plurality of optical parts, such as mirrors and lenses, in order to shift, diverge, converge, and/or re-image an image. For example, such an optical element or optical system may include a flat mirror, a retroreflective mirror, and the like.

Now referring back to FIG. 1, one exemplary lithographic exposure device that incorporates the present invention will be briefly described. A typical exposure apparatus 100 includes a mounting base 102, a support frame 104, a base frame 106, a measurement system 108, a control system (not shown), an illumination system 110, an optical frame 112, an optical device 114, a reticle stage 116 for retaining a reticle 118, an upper enclosure 120 surrounding reticle stage 116, a wafer stage 122, a wafer table 123 for retaining a semiconductor wafer workpiece 124, and a lower enclosure 126 surrounding wafer stage 122.

Figure 1:
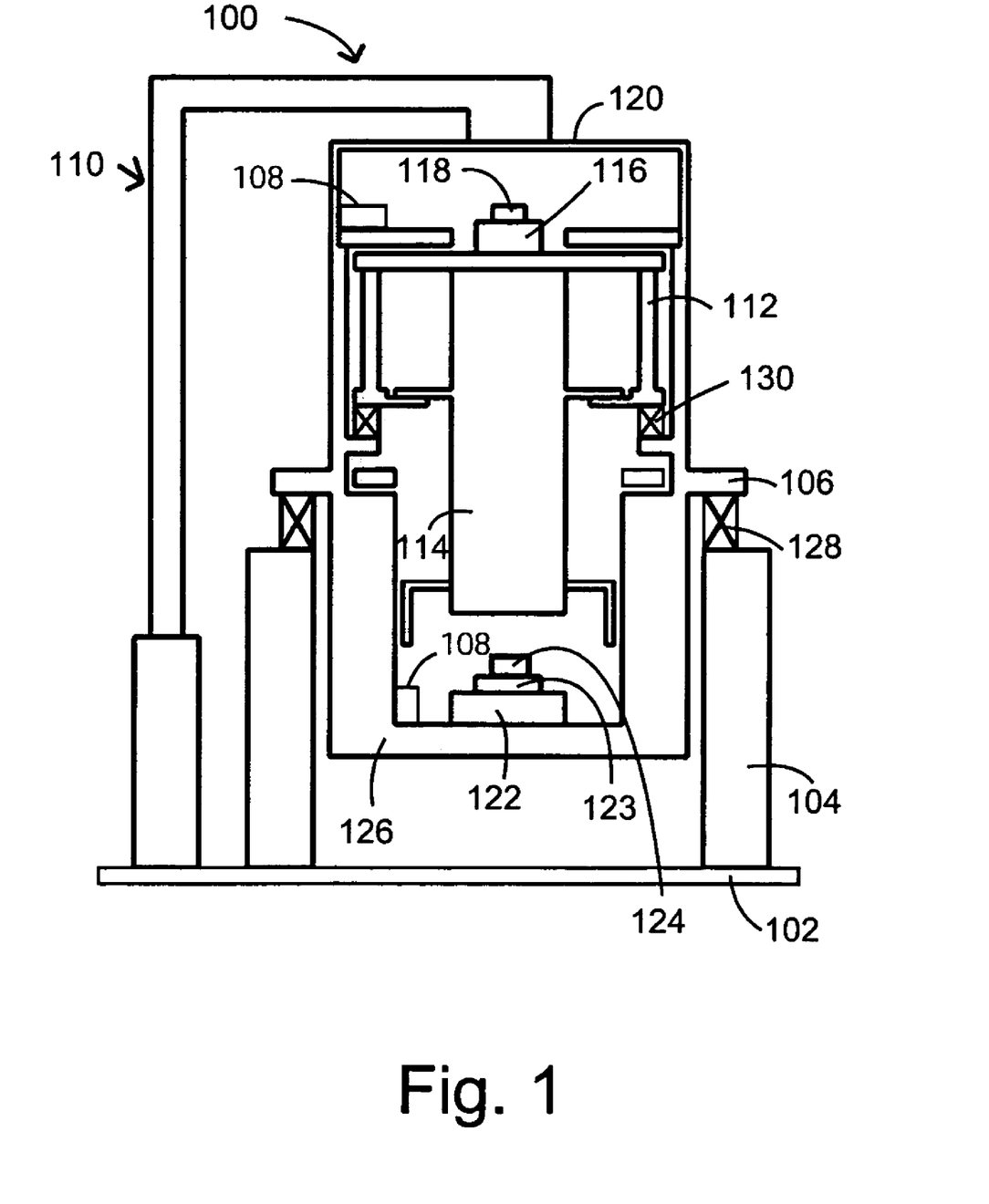
FIG. 1 is a cross-sectional view of an exemplary lithographic exposure apparatus that incorporates the present invention.

The support frame 104 typically supports base frame 106 above mounting base 102 through a base vibration isolation system 128. Base frame 106 in turn supports, through an optical vibration isolation system 130, optical frame 112, measurement system 108, reticle stage 116, upper enclosure 120, optical device 114, wafer stage 122, wafer table 123 and lower enclosure 126 above base frame 106. Optical frame 112 in turn supports optical devise 114 and reticle stage 116 above base frame 106 through optical vibration isolation system 130. As a result thereof, optical frame 112 and its supported components and base frame 106 are effectively attached in series through base vibration isolation system 128 and optical vibration isolation system 130 to mounting base 102. Vibration isolation systems 128 and 130 are designed to damp and isolate vibrations between components of exposure apparatus 100. Measurement system 108 monitors the positions of stages 116 and 122 relative to a reference such as optical device 114 and outputs position data to the control system. Optical device 114 typically includes a lens assembly that projects and/or focuses the light or beam from an illumination system 110 that passes through reticle: 118. Reticle stage 116 is attached to one or more movers (not shown) directed by the control system to precisely position reticle 118 relative to optical device 114. Similarly, wafer stage 122 includes one or more movers (not shown) to precisely position the wafer workpiece 124 with wafer table 123 relative to optical device (lens assembly) 114.

Wafer table 123 moves relative to wafer stage 122 by the mover (for example, electromagnetic actuator utilizing Lorentz type force) for leveling and focusing motions of wafer workpiece 124. The actuator may include a plurality of actuators disposed between wafer stage 122 and wafer table 123 so that wafer table 123 can move relative to wafer stage 122 in six degrees of freedom (X, Y, Z, θx, θy, θz). The wafer stage 122 and the wafer table 123 may have a shielding member that shields magnetic fields generated by the magnetic materials of the anti-gravity mount 400 so that the magnetic fields do not adversely affect the devices mounted around the wafer stage 122 and the wafer table 123. Further, air bellows may be utilized to support wafer table 123 relative to wafer stage 122 in addition to the anti-gravity mount 400 of this invention. This embodiment of the present invention may be utilized for reticle stage 116 in addition to wafer stage 122 by providing a reticle table that retains reticle 118 and moves relative to stage 116.

As will be appreciated by those skilled in the art, there are a number of different types of photolithographic devices. For example, exposure apparatus 100 can be used as a scanning type photolithography system which exposes the pattern from reticle 118 onto wafer 124 with reticle 118 and wafer 124 moving synchronously. In a scanning type lithographic device, reticle 118 is moved perpendicular to an optical axis of optical device 114 by reticle stage 116 and wafer 124 is moved perpendicular to an optical axis of optical device 114 by wafer stage 122. Scanning of reticle 118 and wafer 124 occurs while reticle 118 and wafer 124 are moving synchronously.

Alternately, exposure apparatus 100 can be a step-and-repeat type photolithography system that exposes reticle 118 while reticle 118 and wafer 124 are stationary. In the step and repeat process, wafer 124 is in a constant position relative to reticle 118 and optical device 114 during the exposure of an individual field. Subsequently, between consecutive exposure steps, wafer 124 is consecutively moved by wafer stage 122 perpendicular to the optical axis of optical device 114 so that the next field of semiconductor wafer 124 is brought into position relative to optical device 114 and reticle 118 for exposure. Following this process, the images on reticle 118 are sequentially exposed onto the fields of wafer 124 so that the next field of semiconductor wafer 124 is brought into position relative to optical device 114 and reticle 118.

However, the use of exposure apparatus 100 provided herein is not limited to a photolithography system for a semiconductor manufacturing. Exposure apparatus 100, for example, can be used as an LCD photolithography system that exposes a liquid crystal display device pattern onto a rectangular glass plate or a photolithography system for manufacturing a thin film magnetic head. Further, the present invention can also be applied to a proximity photolithography system that exposes a mask pattern by closely locating a mask and a substrate without the use of a lens assembly. Additionally, the present invention provided herein can be used in other devices, including other semiconductor processing equipment, machine tools, metal cutting machines, and inspection machines. The present invention is desirable in machines where it is desirable to prevent the transmission of vibrations.

The illumination source (of illumination system 110) can be g-line (436 nm), i-line (365 nm), KrF excimer laser (248 nm), ArF excimer laser (193 nm) and $F_2$ laser (157 nm). Alternatively, the illumination source can also use charged particle beams such as x-ray and electron beam. For instance, in the case where an electron beam is used, thermionic emission type lanthanum hexaboride ($LaB_6$,) or tantalum (Ta) can be used as an electron gun. Furthermore, in the case where an electron beam is used, the structure could be such that either a mask is used or a pattern can be directly formed on a substrate without the use of a mask.

With respect to optical device 114, when far ultra-violet rays such as the excimer laser is used, glass materials such as quartz and fluorite that transmit far ultra-violet rays is preferably used. When the $F_2$ type laser or x-ray is used, optical device 114 should preferably be either catadioptric or refractive (a reticle should also preferably be a reflective type).

Also, with an exposure device that employs vacuum ultra-violet radiation (VUV) of wavelength 200 nm or lower, use of the catadioptric type optical system can be considered. Examples of the catadioptric type of optical system include the disclosure Japan Patent Application Disclosure No. 8-171054 published in the Official Gazette for Laid- Open Patent Applications and its counterpart U.S. Pat. No. 5,668,672, as well as Japan Patent Application Disclosure No. 10-20195 and its counterpart U.S. Pat. No. 5,835,275. In these cases, the reflecting optical device can be a catadioptric optical system incorporating a beam splitter and concave mirror. Japan Patent Application Disclosure No. 8-334695 published in the Official Gazette for Laid-Open Patent Applications and its counterpart U.S. Pat. No. 5,689,377 as well as Japan Patent Application Disclosure No. 10-3039 also use a reflecting-refracting type of optical system incorporating a concave mirror, etc., but without a beam splitter, and can also be employed with this invention. The disclosures in the above mentioned U.S. patents, as well as the Japan patent applications published in the Official Gazette for Laid-Open Patent Applications are incorporated herein by reference.

Further, in photolithography systems, when linear motors (see U.S. Pat. Nos. 5,623,853 or 5,528,118) are used in a wafer stage or a reticle stage, the linear motors can be either an air levitation type employing air bearings or a magnetic levitation type using Lorentz force or reactance force. Additionally, the stage could move along a guide, or it could be a guideless type stage which uses no guide. The disclosures in U.S. Pat. Nos. 5,623,853 and 5,528,118 are incorporated herein by reference.

Alternatively, one of the stages could be driven by a planar motor, which drives the stage by electromagnetic force generated by a magnet unit having two-dimensionally arranged magnets and an armature coil unit having two-dimensionally arranged coils in facing positions. With this type of driving system, either one of the magnet unit or the armature coil unit is connected to the stage and the other unit is mounted on the moving plane side of the stage.

Movement of the stages as described above generates reaction forces which can affect performance of the photolithography system. Reaction forces generated by the wafer (substrate) stage motion can be mechanically released to the floor (ground) by use of a frame member as described in U.S. Pat. No. 5,528,118 and published Japanese Patent Application Disclosure No. 8-166475. Additionally, reaction forces generated by the reticle (mask) stage motion can be mechanically released to the floor (ground) by use of a frame member as described in U.S. Pat. No. 5,874,820 and published Japanese Patent Application Disclosure No. 8-330224. The disclosures in U.S. Pat. Nos. 5,528,118 and 5,874,820 and Japanese Patent Application Disclosure No. 8-330224 are incorporated herein by reference.

As described above, a photolithography system according to the above described embodiments can be built by assembling various subsystems, including each element listed in the appended claims, in such a manner that prescribed mechanical accuracy, electrical accuracy and optical accuracy are maintained. In order to maintain the various accuracies, prior to and following assembly, every optical system is adjusted to achieve its optical accuracy. Similarly, every mechanical system and every electrical system are adjusted to achieve their respective mechanical and electrical accuracies. The process of assembling each subsystem into a photolithography system includes mechanical interfaces, electrical circuit wiring connections and air pressure plumbing connections between each subsystem. Needless to say, there is also a process where each subsystem is assembled prior to assembling a photolithography system from the various subsystems. Once a photolithography system is assembled using the various subsystems, total adjustment is performed to make sure that every accuracy is maintained in the complete photolithography system. Additionally, it is desirable to manufacture an exposure system in a clean room where the temperature and humidity are controlled.

Figure 2:
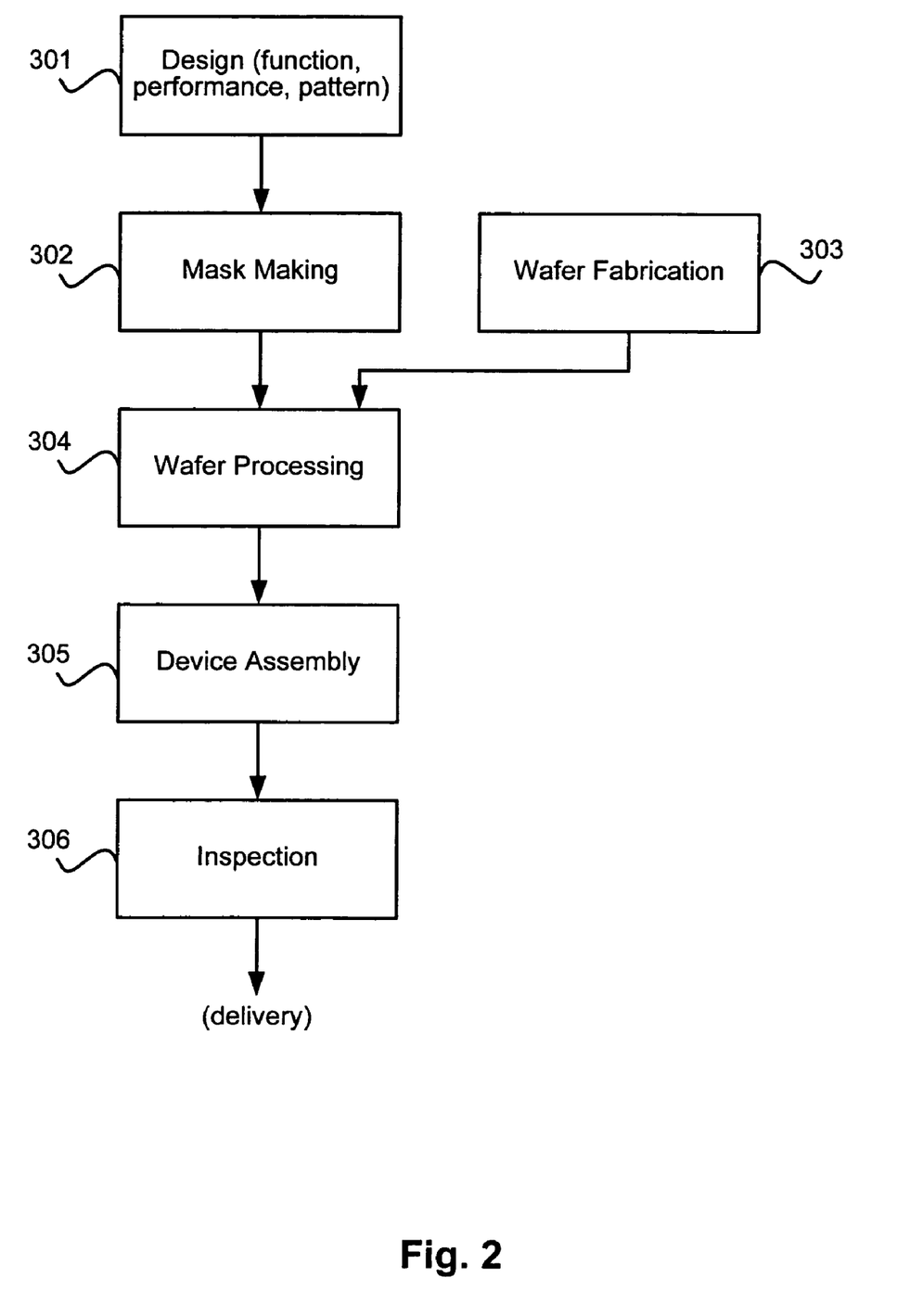
FIG. 2 is a process flow diagram illustrating an exemplary process by which semiconductor devices are fabricated using the systems shown in FIG. 1 according to the present invention.

Further, semiconductor devices can be fabricated using the above described systems, by the process shown generally in FIG. 2. In step 301, the device's function and performance characteristics are designed. Next, in step 302, a mask (reticle) having a pattern is designed according to the previous designing step, and in a parallel step 303, a wafer is made from a silicon material. The mask pattern designed in step 302 is exposed onto the wafer from step 303 in step 304 by a photolithography system such as the systems described above. In step 305 the semiconductor device is assembled (including the dicing process, bonding process and packaging process), then finally the device is inspected in step 306.

Figure 3:
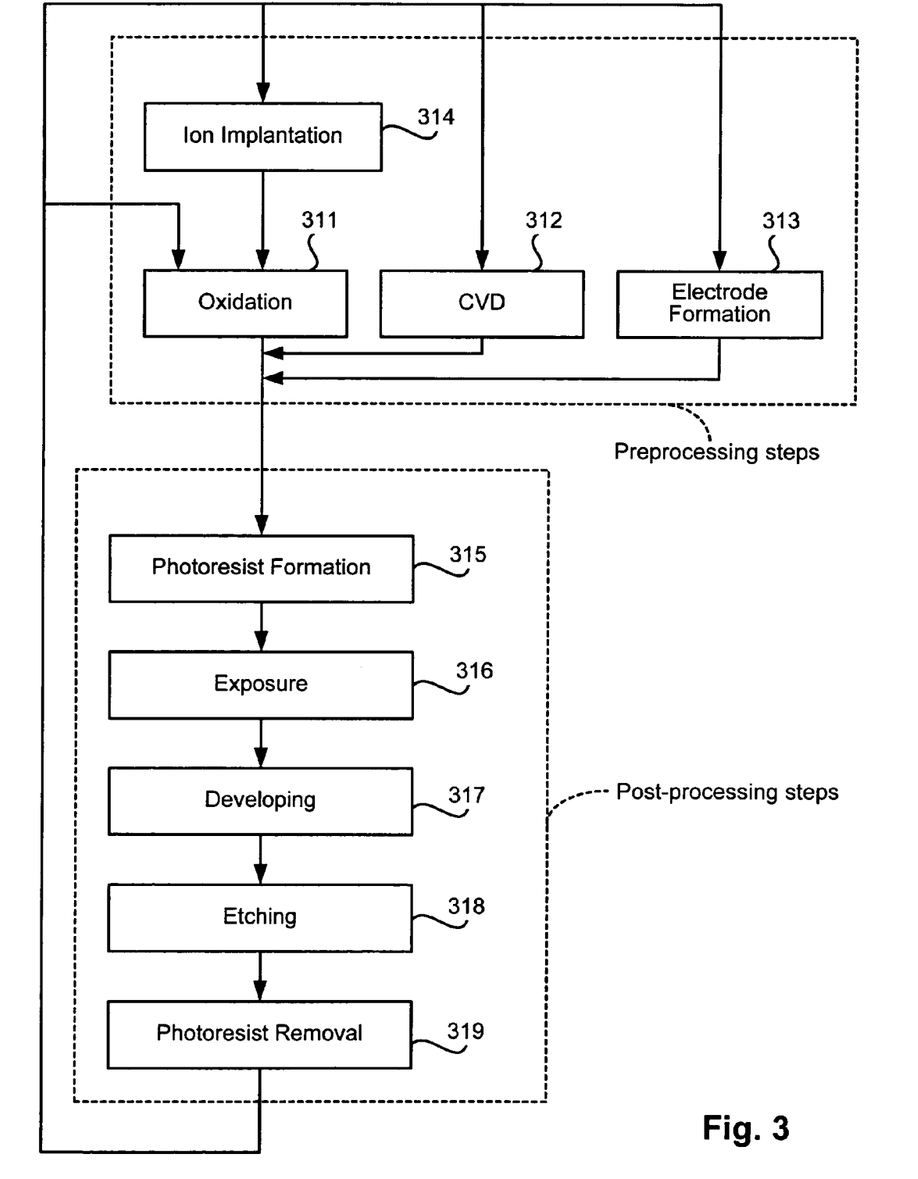
FIG. 3 is a flowchart of the wafer processing step shown in FIG. 2 in the case of fabricating semiconductor devices according to the present invention.

FIG. 3 illustrates a detailed flowchart example of the above-mentioned step 304 in the case of fabricating semiconductor devices. In step 311 (oxidation step), the wafer surface is oxidized. In step 312 (CVD step), an insulation film is formed on the wafer surface. In step 313 (electrode formation step), electrodes are formed on the wafer by vapor deposition. In step 314 (ion implantation step), ions are implanted in the wafer. The above mentioned steps 311-314 form the preprocessing steps for wafers during wafer processing, and selection is made at each step according to processing requirements.

At each stage of wafer processing, when the above-mentioned preprocessing steps have been completed, the following post-processing steps are implemented. During post-processing, initially, in step 315 (photoresist formation step), photoresist is applied to a wafer. Next, in step 316, (exposure step), the above-mentioned exposure device is used to transfer the circuit pattern of a mask (reticle) to a wafer. Then, in step 317 (developing step), the exposed wafer is developed, and in step 318 (etching step), parts other than residual photoresist (exposed material surface) are removed by etching. In step 319 (photoresist removal step), unnecessary photoresist remaining after etching is removed. Multiple circuit patterns are formed by repetition of these preprocessing and post-processing steps.

It should be appreciated that various embodiments of the present invention described referring to FIGS. 4-7 may be utilized and/or incorporated with apparatus and methods described referring to FIGS. 1-3.

Although the foregoing invention has been described in some detail for purposes of clarity of understanding, it will be apparent that certain changes and modifications may be practiced within the scope of the appended claims. It should be noted that there are many alternative ways of implementing both the process and apparatus of the present invention. Accordingly, the present embodiments are to be considered as illustrative and not restrictive, and the invention is not to be limited to the details given herein, but may be modified within the scope and equivalents of the appended claims.

What is claimed is:

1. An apparatus for adjusting image formation, comprising:
   a first stage operable to project an original image;
   a second stage on which a final image corresponding to the original image is formed;
   an optical element movable with at least one degree of freedom operable to shift a position of the final image,
   a counterweight movable with the at least one degree of freedom; and
   an actuator, placed between the optical element and the counter weight, operable to actuate the optical element and the counterweight in opposite directions.

2. The apparatus of claim 1, wherein a weight of the counterweight is substantially the same as a weight of the optical element.

3. The apparatus of claim 1, wherein the optical element is a mirror.

4. The apparatus of claim 3, where the counterweight has the same degree of freedom as the optical element.

5. The apparatus of claim 1, wherein the first stage is operable to hold a reticle, the second stage is operable to hold a wafer.

6. The apparatus of claim 5, wherein the first stage and second stage move synchronously to provide a synchronous scanning of the reticle and the wafer.

7. The apparatus of claim 1, further comprising a controller operable to receive
   a first input corresponding to a desired final image position, and
   a second input corresponding to an actual final image position; and based on the desired final image position and the actual final image position, to output
   a first output for actuating the optical element, wherein the actuator actuates the optical element based on the first output.

8. The apparatus of claim 7, wherein the controller is operable to output a second output for actuating the first stage, and to output a third output for actuating the second stage.

9. The apparatus of claim 1, the optical element is a flat mirror and is actuated to tilt with respect to an axis connecting the original image and the final image.

10. The apparatus of claim 1, the optical element is a retroreflective mirror and is actuated to move substantially perpendicular to an axis connecting the original image and the final image.

11. The apparatus of claim 1, wherein the optical element and the counterweight have two degrees of freedom.

12. A method for adjusting image formation, comprising:
   projecting an original image from a first stage;
   forming a final image corresponding to the original image on a second stage;
   actuating an optical element and
   a counterweight by an actuator placed between the optical element and the counterweight in opposite directions to shift a position of the final image.

13. The method of claim 12, further comprising placing a reticle on the first stage and placing a wafer on the second stage.

14. The method of claim 12, further comprising moving the first stage and second stage synchronously to provide a synchronous scanning of the reticle and the wafer.

15. The method of claim 12, wherein the optical element is a mirror.

16. The method of claim 15, where the counterweight has the same degree of freedom as the optical element.

17. The method of claim 12, wherein a weight of the counterweight is substantially the same as a weight of the optical element.

18. The method of claim 12, further comprising a controller operable to receive
   a first input corresponding to a desired final image position, and
   a second input corresponding to an actual final image position; and based on the desired final image position and the actual final image position, to output
   a first output for actuating the optical element, wherein the actuator actuates the optical element based on the first output.

19. The method of claim 18, wherein the controller is operable to output a second output for actuating the first stage, and to output a third output for actuating the second stage.

20. The method of claim 12, the optical element is a flat mirror and is actuated to tilt with respect to an axis connecting the original image and the final image.

21. The method of claim 12, the optical element is a retroreflective mirror and is actuated to move substantially perpendicular to an axis connecting the original image and the final image.

22. The method of claim 12, wherein the optical element and the counterweight have two degrees of freedom.

23. A method for making an object using a lithography process, wherein the lithography process utilizes the method of claim 12.

24. A method for patterning a wafer using a lithography process, wherein the lithography process utilizes the method of claim 12.

* * * * *